US008824842B2

(12) United States Patent
Matsumoto

(10) Patent No.: US 8,824,842 B2
(45) Date of Patent: Sep. 2, 2014

(54) OPTICAL SEMICONDUCTOR DEVICE AND METHOD FOR FABRICATING THE OPTICAL SEMICONDUCTOR DEVICE

(75) Inventor: Takeshi Matsumoto, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 56 days.

(21) Appl. No.: 13/043,277

(22) Filed: Mar. 8, 2011

(65) Prior Publication Data
US 2011/0229079 A1      Sep. 22, 2011

(30) Foreign Application Priority Data

Mar. 19, 2010  (JP) ................. 2010-064764

(51) Int. Cl.
| | |
|---|---|
| G02B 6/34 | (2006.01) |
| H01L 33/00 | (2010.01) |
| G02B 6/12 | (2006.01) |
| H01S 5/22 | (2006.01) |
| G02B 6/124 | (2006.01) |
| H01L 21/02 | (2006.01) |
| B82Y 20/00 | (2011.01) |
| H01S 5/12 | (2006.01) |
| H01S 5/32 | (2006.01) |
| H01S 5/34 | (2006.01) |

(52) U.S. Cl.
CPC ............ *G02B 6/124* (2013.01); *G02B 6/12007* (2013.01); *H01S 5/2201* (2013.01); *H01S 5/1218* (2013.01); *H01L 21/02507* (2013.01); *H01L 21/02463* (2013.01); *B82Y 20/00* (2013.01); *H01L 21/02395* (2013.01); *H01S 5/1231* (2013.01); *H01S 5/02579* (2013.01); *H01L 21/02513* (2013.01); *H01L 21/02576* (2013.01); *H01L 21/02546* (2013.01); *H01S 2304/04* (2013.01); *H01S 5/3202* (2013.01); *H01L 21/02639* (2013.01); *H01S 5/3412* (2013.01)
USPC .............................................. 385/37; 385/32

(58) Field of Classification Search
CPC .. G02B 5/207; G02B 27/4272; G02B 5/1819; G02B 5/008; G02B 5/1809; G02B 2006/12107; G02B 5/18; G02B 6/34; G02B 6/12; G02B 27/44; G02B 5/1814; G02B 5/1861; G02B 5/1828; G02B 5/1833
USPC ........................................................ 385/37, 32
See application file for complete search history.

(56) References Cited

U.S. PATENT DOCUMENTS 5,292,685 A * 3/1994 Inoguchi et al. ................ 438/32
5,343,486 A * 8/1994 Itaya et al. .................. 372/43.01

(Continued)

FOREIGN PATENT DOCUMENTS

| JP | 09-186394 A | 7/1997 |
|---|---|---|
| JP | 2000-019316 A | 1/2000 |
| JP | 2008-218996 A | 9/2008 |

*Primary Examiner* — Kaveh Kianni
(74) *Attorney, Agent, or Firm* — Fujitsu Patent Center

(57) ABSTRACT

An optical semiconductor device, includes: a plurality of first diffraction grating layers disposed at a spacing from each other along first direction above first semiconductor layer, length of a lower surface of each of a plurality of first diffraction gratings along first direction being longer than a length of an upper surface of first diffraction grating; second diffraction grating layer disposed along first direction above first semiconductor layer, first and second diffraction grating layers being alternately disposed at a spacing from each other, a length of an upper surface of second diffraction grating layer along first direction being longer than the length of a lower surface of second diffraction layer; a diffraction grating including first and second diffraction grating layers; a second semiconductor layer disposed between first and second diffraction grating layers and under second diffraction grating layer; and third semiconductor layer disposed on first and second diffraction grating layers.

9 Claims, 17 Drawing Sheets

(56) References Cited

U.S. PATENT DOCUMENTS

| | | | |
|---|---|---|---|
| 5,448,581 A * | 9/1995 | Wu et al. | 372/45.01 |
| 5,970,081 A * | 10/1999 | Hirayama et al. | 372/96 |
| 6,151,347 A * | 11/2000 | Noel et al. | 372/45.01 |
| 6,455,338 B1 * | 9/2002 | Takagi et al. | 438/24 |
| 6,477,191 B1 * | 11/2002 | Okada et al. | 372/50.11 |
| 7,194,016 B2 * | 3/2007 | Bullington et al. | 372/108 |
| 7,553,774 B2 * | 6/2009 | Nomaguchi | 438/725 |
| 7,586,970 B2 * | 9/2009 | Kanskar et al. | 372/96 |
| 2002/0192849 A1 * | 12/2002 | Bullington et al. | 438/22 |
| 2002/0192850 A1 * | 12/2002 | Stoltz et al. | 438/22 |
| 2003/0147617 A1 * | 8/2003 | Park et al. | 385/131 |
| 2004/0165637 A1 * | 8/2004 | Bullington et al. | 372/50 |
| 2010/0322557 A1 * | 12/2010 | Matsuda et al. | 385/37 |
| 2011/0317093 A1 * | 12/2011 | Medendorp et al. | 349/61 |
| 2012/0002285 A1 * | 1/2012 | Matsuda | 359/576 |

* cited by examiner

OPTICAL SEMICONDUCTOR DEVICE AND METHOD FOR FABRICATING THE OPTICAL SEMICONDUCTOR DEVICE

CROSS REFERENCE TO RELATED APPLICATION

This application is based upon and claims the benefit of priority from the prior Japanese Patent Application No. 2010-064764 filed on Mar. 19, 2010, the entire contents of which are incorporated herein by reference.

FIELD

The embodiments discussed herein related to an optical semiconductor device and a method for fabricating the optical semiconductor device.

BACKGROUND

Optical devices that include a diffraction grating are known in the field of optoelectronics, such as certain types of optical filters, optical couplers, distributed-feedback (DFB) semiconductor lasers, and distributed Bragg reflector (DBR) lasers.

In wavelength controlling semiconductor lasers or wavelength-tunable semiconductor lasers that have a diffraction grating, such as DFB and DBR semiconductor lasers, for example, parameters such as the period, shape and depth of the diffraction grating greatly affect laser characteristics such as the coupling coefficient and lasing threshold. Therefore, it is important to fabricate a precise diffraction grating in a highly controllable manner.

A commonly used method for fabricating diffraction gratings involves two steps: forming a photoresist mask patterned in the shape of a grating and etching the regions that are not covered with the mask.

Widely used methods for forming the grating pattern photoresist are electron beam (EB) exposure and holographic exposure.

To expose a photoresist by the EB exposure, first the photoresist is applied onto a silicon oxide film formed on a compound semiconductor film and is baked. Then the photoresist is irradiated with an electron beam to form a striped grating latent image having a period $\Lambda$ on the photoresist.

The electron beam used in the EB exposure is produced by focusing a stream of electrons emitted from an electron gun through the use of a lens. The shape, size and deflection position are controlled with optics such as a deflector, electron lens, and aperture.

To expose a photoresist by the holographic exposure, first the photoresist is applied onto a silicon oxide film formed on a compound semiconductor film and is baked. Then the photoresist is irradiated with laser beams from two directions to form a latent image of a holographic pattern.

The period $\Lambda$ of the holographic pattern is $\Lambda = \lambda/2 \sin \theta$, where $\theta$ is the incident angle of the two laser beams and $\lambda$ is the wavelength. For example, an Ar laser having a wavelength $\lambda$ of 351 or a He—Cd laser having a wavelength $\lambda$ of 325 nm is used for the exposure. With such a laser, a first-order diffraction grating used in a DFB semiconductor laser having an emission wavelength in a 1.3 µm band or of 1.55 µm may be readily and reproducibly fabricated.

The latent image of the photoresist formed by any of these exposure methods is developed to form a visible image, which is used as resist mask having a grating pattern. Regions in the silicon oxide film that are exposed in the resist mask are etched into a grating pattern by dry etching, for example.

The grating-patterned silicon oxide film is used as a mask in etching of the compound semiconductor film. Regions of the compound semiconductor film that are exposed in the grating-patterned silicon oxide film are etched to form a diffraction grating having periodic grooves and ridges having a period $\Lambda$.

Recently compact and high modulation red, green and blue lasers are needed for micro projection displays. Semiconductor lasers of red and blue wavelength bands among the three primary color bands are commercially available, but a semiconductor laser that emits light of a green wavelength band, for example a wavelength of 532 nm, has not been made commercially available.

Therefore, a device including an excitation light source of a wavelength in a 1.06 µm band and a second harmonic generation (SHG) device is commonly used as a green-light emitter. In that case, a DFB or DBR semiconductor laser, for example, is used as the excitation light source. Fundamental laser light emitted from such a semiconductor laser is converted to laser light having a ½ wavelength through the SHG device.

The period $\Lambda$ of a first-order diffraction grating formed in a waveguide of the DFB or DBR semiconductor laser used in the green light emitter is 158 nm.

EB exposure may be used to form the diffraction grating having a period $\Lambda$ of 158 nm. However, the EB exposure involves scanning with an electron beam as many times as the number of rulings of the diffraction grating, requesting long exposure time per substrate. Therefore, a diffraction grating fabrication method that uses the EB exposure does not lend itself to volume production.

In contrast, the holographic exposure requests a short exposure time. However, the period $\Lambda$ of the diffraction grating that may be fabricated is restricted by the wavelength of laser light used for exposure and is also affected by the numerical aperture (NA) of the optical system of exposure equipment. The period $\Lambda$ of repetition of grooves and ridges of the first-order diffraction grating that may be fabricated is 175 nm at the shortest. Therefore, it is difficult to form a latent image of a first-order diffraction grating having a period of approximately 158 nm by the holographic exposure.

It may be contemplated to fabricate a second or higher order diffraction grating by holographic exposure. However, a higher-order diffraction grating has a larger light scattering loss and therefore lower emission efficiency. Therefore it is difficult to improve laser characteristics with holographic exposure. As is appreciated, a second-order diffraction grating has a period $2\Lambda$ twice the period $\Lambda$ of a first-order grating.

There is a known method for fabricating a first-order diffraction grating constituting a short-wavelength DFB or DBR semiconductor laser made of a GaAs-based material as described below.

A holographic exposure method and a process such as wet etching with a $H_2SO_4$-based etchant are used to form a second-order diffraction grating having a period $2\Lambda$ on an optical waveguide made of p-AlGaAs.

Then a light absorbing layer is formed on multiple ridges in the diffraction grating while at the same time a light absorbing layer is formed on the bottom of grooves between the ridges. The light absorbing layers are used as a first-order diffraction grating having a period $\Lambda$.

[Patent document 1] Japanese Laid-open Patent Publication No. 2008-218996

[Patent document 2] Japanese Laid-open Patent Publication No. 2000-019316

[Patent document 3] Japanese Laid-open Patent Publication No. 09-186394

SUMMARY

According to one aspect of the embodiments, there is provided an optical semiconductor device including: a first semiconductor layer; a plurality of first diffraction grating layers disposed at a spacing from each other along a first direction above the first semiconductor layer, the length of a lower surface of each of the plurality of first diffraction gratings along the first direction being longer than or equal to the length of an upper surface of the first diffraction grating; a second diffraction grating layer disposed along the first direction above the first semiconductor layer, the first and second diffraction grating layers being alternately disposed at a spacing from each other, the length of an upper surface of the second diffraction grating layer along the first direction being longer than the length of a lower surface of the second diffraction layer; a diffraction grating including the first and second diffraction grating layers; a second semiconductor layer disposed under a region between the first and second diffraction grating layers and under the second diffraction grating layer, the second semiconductor layer having a refractive index different from any of the first and second diffraction grating layers; and a third semiconductor layer disposed on the first and second diffraction grating layers, the third semiconductor layer having a refractive index different from any of the first and second diffraction grating layers.

According to another aspect, there is provided a method for fabricating an optical semiconductor device including the steps of: forming a first semiconductor layer and a first diffraction grating layer above a substrate; forming a grating pattern mask above the second diffraction grating layer, the mask including a plurality of stripes spaced from each other along a first direction; etching the first diffraction grating layer exposed in the grating pattern mask; etching the first semiconductor layer exposed in the grating pattern mask to form a plurality of ridges in the first semiconductor layer along the first direction; forming a second semiconductor layer on a bottom surface of a groove formed between adjacent ones of the plurality of ridges; selectively forming a second diffraction grating layer in grooves in the second semiconductor layer, the grooves being above the grooves between the ridges; and forming a third semiconductor layer on a diffraction grating including the first and second diffraction grating layers and on the second semiconductor layer.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 1A:
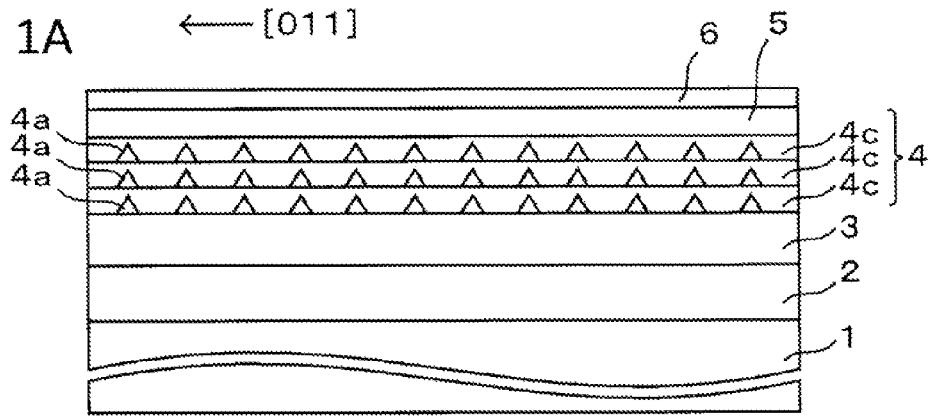
FIGS. 1A to 1J are cross-sectional views illustrating a process of fabricating an optical semiconductor device according to a first embodiment, taken along a wave guiding direction.

There is a method for fabricating a diffraction grating in which grooves and ridge having a period $2\Lambda$ are formed in an upper portion of an optical waveguide layer of AlGaAs and light absorbing layers of GaAs are formed on the upper surface of the ridge and on the bottom surface of the grooves. The multiple GaAs light absorbing layers are used as a first-order diffraction grating having a period $\Lambda$.

In the diffraction grating fabrication method, if the light absorbing layer to be formed on the AlGaAs having grooves and ridges with a period $2\Lambda$ is of a phosphorous (P)-based semiconductor, the light absorbing is not easily formed on the upper surface of the ridges while it is easily formed in the grooves. Accordingly, it is difficult to form a first-order grating of a P-based compound semiconductor layer by the diffraction grating fabrication method.

Furthermore, if the difference in height between the grooves and ridges is small, a sufficient spacing may not be provided between the upper and lower light absorbing layers constituting the diffraction grating. In contrast, if the difference in height is large, the whole diffraction grating will be thick.

The GaAs light absorbing layer is grown on the bottom surface of the grooves and the top surface of the ridges in the top portion of the AlGaAs optical waveguide layer at a temperature of 750° C.

Such a high temperature may cause thermal deformation of the grooves and ridges, depending on the material of the optical waveguide layer. Thermal deformation of the grooves and ridges may deviate the light coupling coefficient κ of the diffraction grating formed on the grooves and ridges from an assumed value.

The high temperature may also degrade quantum dots, if formed, in the active layer under the diffraction grating.

If the optical waveguide layer in which the grooves and ridges are to be formed is made of AlGaAs, the optical waveguide layer resists thermal deformation. However, AlGaAs is easily oxidizable and therefore may degrade the reliability of the optical device.

Preferred embodiments of the present invention that solve these problems will be described with reference to drawings. Like elements are given like reference numerals throughout the drawings.

FIGS. 1A to 1J are cross-sectional views illustrating a process of fabricating a DFB semiconductor laser, which is an optical semiconductor device according to a first embodiment of the present embodiment, viewed from a [−110] direction. The direction from right to left in FIGS. 1A to 1J is a [011] direction.

A method of forming a multilayer structure illustrated in FIG. 1A will be described below.

First, a 300-nm-thick n-type gallium arsenide (GaAs) buffer layer 2 and a 1.5 µm-thick n-type aluminum gallium arsenide ($Al_{0.3}Ga_{0.7}As$) clad layer 3 are formed on a primary surface, for example a (001) plane, of an n-type GaAs substrate 1 by molecular beam epitaxy (MBE). The layers are doped with silicon (Si) as the n-type impurity.

Figure 2:
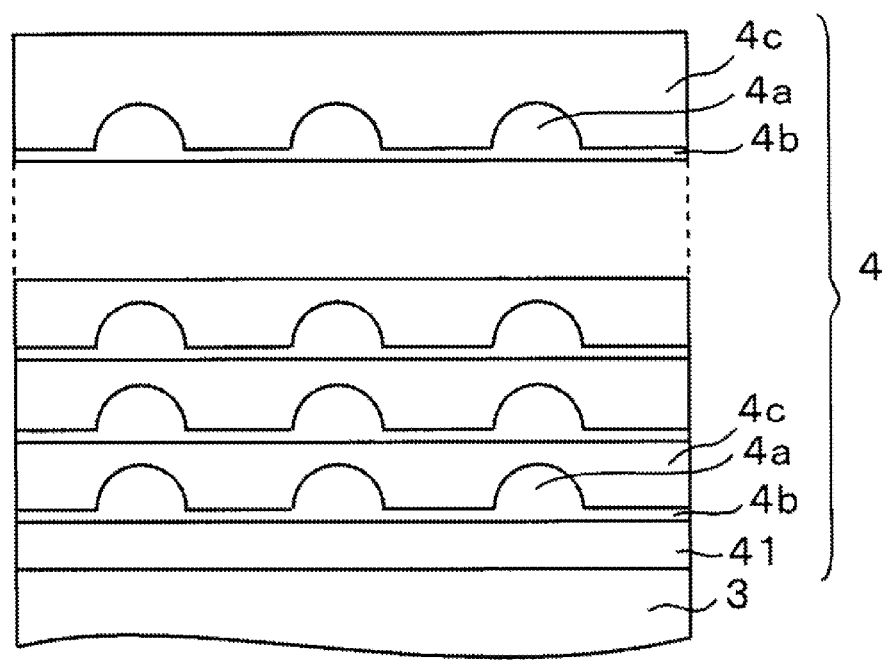
FIG. 2 is a cross-sectional view of an active layer formed in the optical semiconductor device according to the first embodiment, viewed from a light emitting end side.

Then, an active layer 4, for example a quantum dot layer that emits light in a wavelength band of 1.06 µm, is formed on the n-type AlGaAs clad layer 3 by MBE. As illustrated in FIG. 2, the quantum dot layer includes a non-doped GaAs layer 41 formed on the n-type AlGaAs clad layer 3 and a non-doped indium gallium arsenide (InGaAs) quantum dots 4a formed on the GaAs layer 41 to a height equivalent to several monolayers.

An InGaAs wetting layer 4b thinner than the quantum dots 4a is formed around the quantum dots 4a on the GaAs layer 41. A non-doped GaAs layer 4c is formed on the quantum dots 4a and the wetting layer 4b. A multiple layers, for example 10 layers of quantum dots 4a and 10 non-doped GaAs layers 4c are formed alternately.

A 50-nm-thick p-type GaAs waveguide layer 5 and a 20-nm-thick first p-type indium gallium phosphide (InGaP) diffraction grating layer 6 are formed in sequence on the active layer 4 by MBE. The layers are doped with beryllium (Be) as the p-type impurity.

Figure 1B:
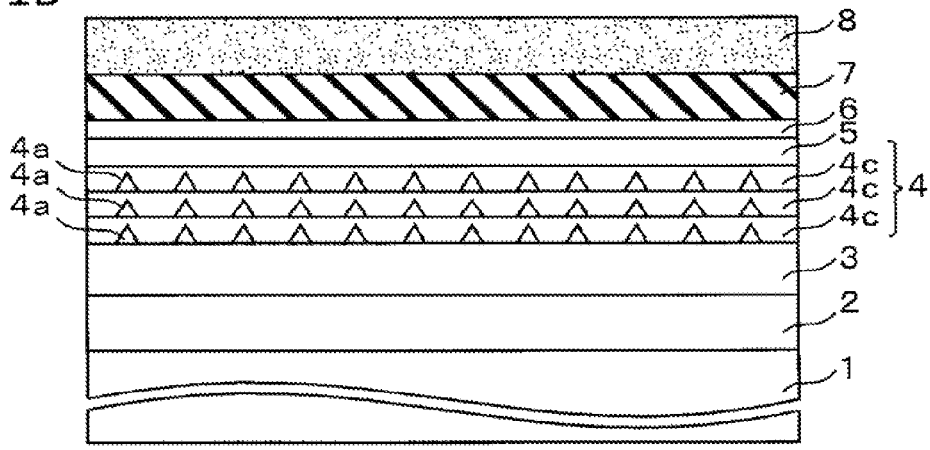

A dielectric film, for example a silicon oxide film 7, is formed on the first p-type InGaP diffraction grating layer 6 by CVD and then a photoresist 8 is applied onto the silicon oxide film 7, as illustrated in FIG. 1B, and is baked.

Figure 1C:
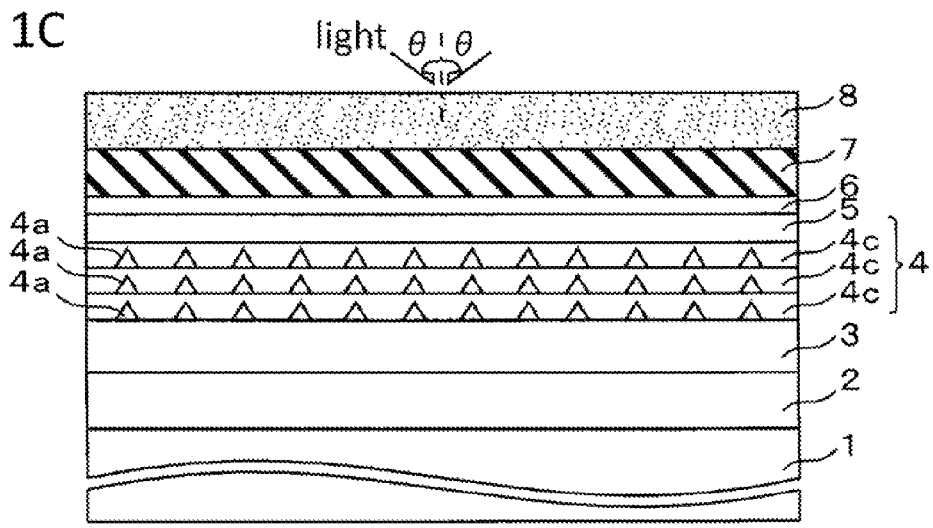

Then, as illustrated in FIG. 1C, the photoresist 8 is exposed by holographic exposure using Ar laser light or He—Cd laser light to form a latent image of a holographic stripe pattern on the photoresist 8.

The period $\Lambda_O$ of the holographic stripes may be expressed as $\Lambda_O = \lambda/2 \sin \theta$, where $\lambda$ is the wavelength of the laser light used in the holographic exposure and $\theta$ is the incident angle of the two laser beams. The period $\Lambda_O$ may be 316 nm, for example. The period $\Lambda_O$ is the period of a second-order diffraction grating, which is twice the period of a first-order diffraction grating, which will be described later.

Figure 1D:
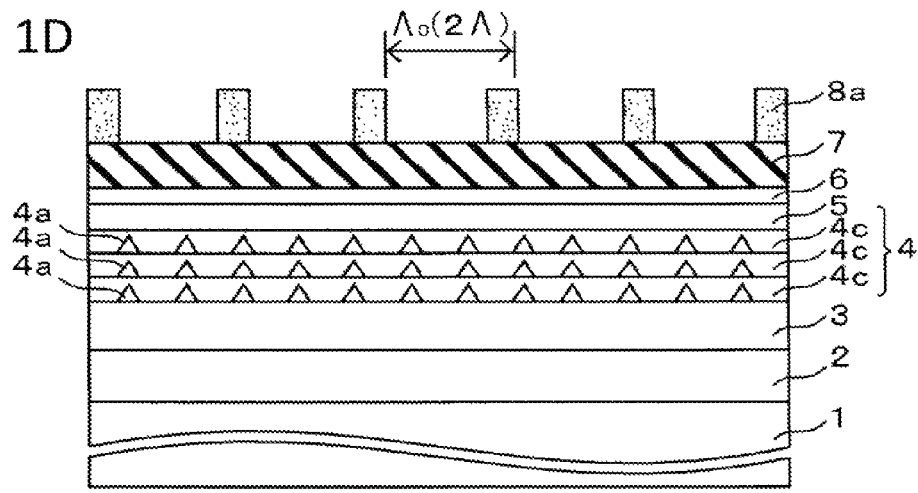

Then, the photoresist 8 is developed and dried. As a result, a grating resist pattern 8a having 79-nm-wide repetitive stripes with a pitch of 316 nm along the direction is formed on the silicon oxide film 7 as illustrated in FIG. 1D.

Figure 1E:
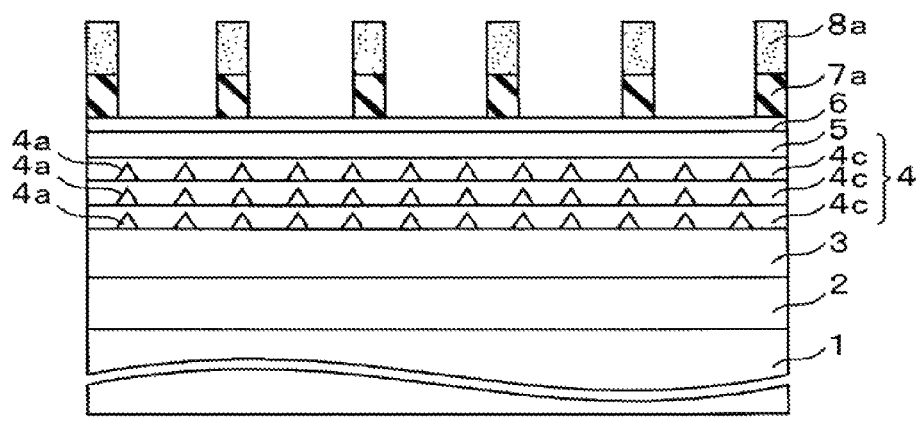

Then, as illustrated in FIG. 1E, regions of the silicon oxide film 7 that are exposed in the resist pattern 8a are etched by reactive ion etching (RIE) with $CF_4$, for example. The silicon oxide film 7 patterned into the shape of a grating will be used as a mask 7a. Then the resist pattern 8a may be removed by using a solvent.

Figure 1F:
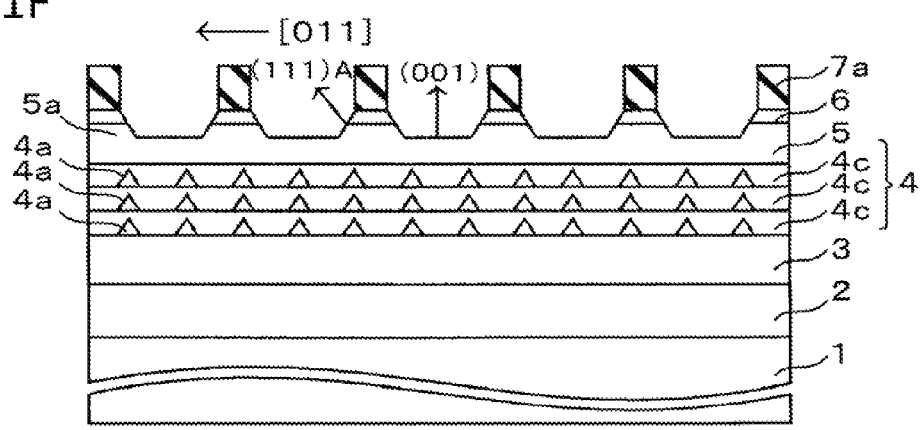

A process of forming a structure illustrated in FIG. 1F will be described below.

First, regions of the first p-type InGaP diffraction grating layer 6 that are exposed in the mask 7a with the grating stripe pattern having a period of $\Lambda_O$ are wet-etched with a hydrochloric-acid-based etchant, for example hydrochloric acid. As a result, the first p-type InGaP diffraction grating layer 6 is patterned in the shape of the grating and the p-type GaAs waveguide layer 5 is exposed in the slits between the grating stripes of the first p-type InGaP diffraction grating layer 6.

Then, the regions of the p-type GaAs waveguide layer 5 that are exposed in the slits in the mask 7a and the grating stripe pattern of the first p-type InGaP diffraction grating layer 6 are wet-etched to a depth of approximately 30 nm, for example, with an ammonium-based etchant, for example a liquid mixture of ammonium, hydrogen peroxide and water.

As a result, multiple periodic ridges are formed on the p-type GaAs waveguide layer 5 along the [011] direction. Each stripe of ridge 5a is approximately 79 nm wide. The pitch of the ridges 5a is equal to the period $2\Lambda$ of the second-order grating, which is approximately 316 nm. Thus, (111) A planes appear on the sides of the ridges 5a. In addition, (001) planes appear at the bottom surfaces of the grooves formed between the ridges 5a. Then, the mask 7a is removed with buffered fluorinated acid.

Figure 1G:
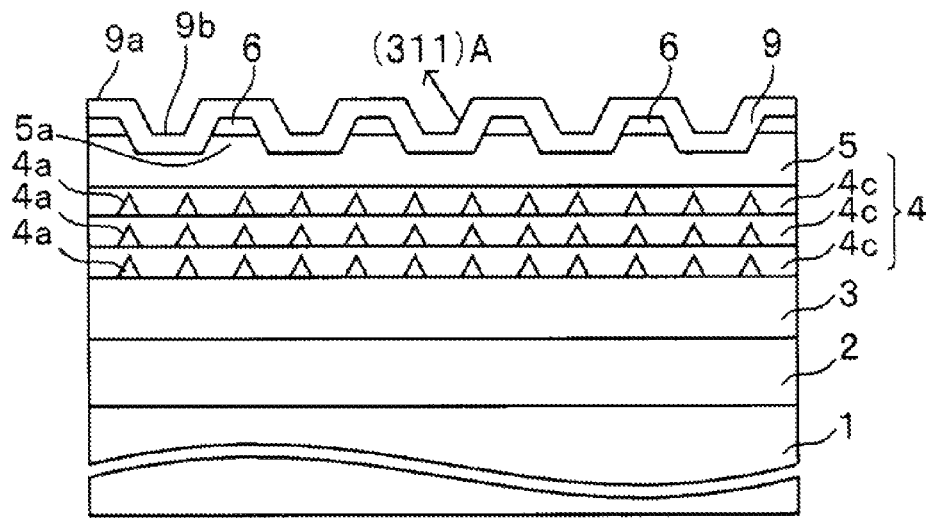

Then, as illustrated in FIG. 1G, a p-type GaAs intermediate layer 9 is formed on the grating-shaped first p-type InGaP diffraction layer 6 and on the p-type GaAs waveguide layer 5 by metal organic chemical vapor deposition (MOCVD). Triethylgallium (TEGa), arsine ($AsH_3$), and diethyl zinc (DEZn), for example, are used as reactive gasses. The growth temperature is set at 500° C. to 650° C., for example 600° C.

The upper surface of the p-type GaAs intermediate layer 9 reflects the surface profile of the first p-type InGaP diffraction grating layer 6 and the p-type GaAs waveguide layer 5, so that ridges 9a and grooves 9b are periodically formed along the [011] direction. (311) A planes appear on the sides of each ridge 9a of the p-type GaAs intermediate layer 9.

The p-type GaAs intermediate layer 9 is formed to such a thickness that the bottom surfaces of the grooves 9b is at the same level as the lower surface of the first p-type InGaP diffraction grating layer 6. In other words, the p-type GaAs intermediate layer 9 is formed to a thickness approximately equal to the height of the ridges 5a of the p-type GaAS waveguide layer 5. Specifically, if the ridges 5a of the p-type GaAs waveguide layer 5 are 30 nm high, the p-type GaAs intermediate layer 9 is formed to a thickness of approximately 30 nm at its grooves 9b. GaAs is grown at a temperature in the range of 500° C. to 650° C., for example 600° C.

Figure 1H:
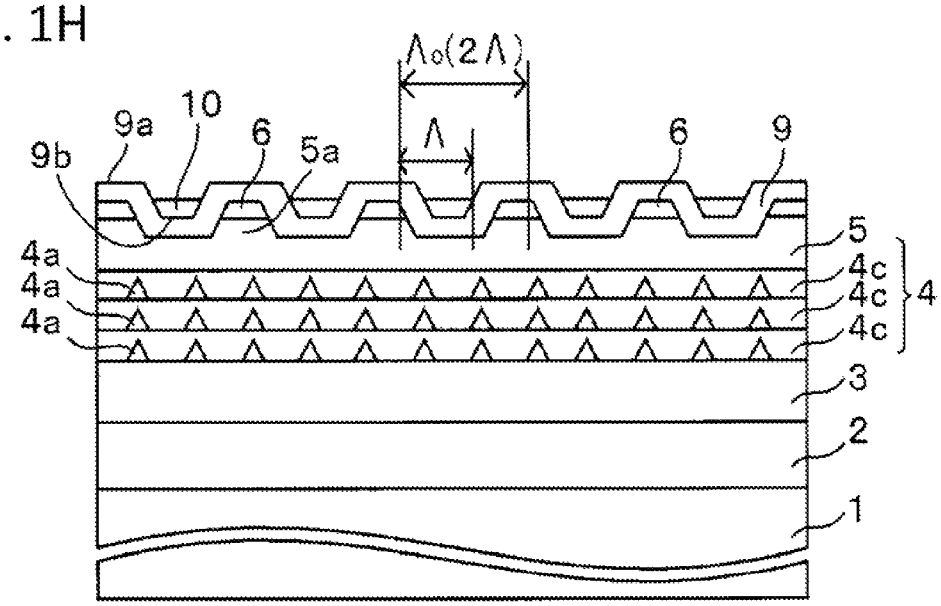

Then, as illustrated in FIG. 1H, a second p-type InGaP diffraction grating layer 10 is formed to a thickness of approximately 20 nm by MOCVD. Trimethylindium (TMI), triethylgallium (TEGa), phosphine (PH3), and diethyl zinc (DEZn), for example, are used as reactive gasses. The growth temperature is set at 550° C. to 700° C., for example 600° C.

Coupling between phosphorus and a group III element, for example Ga, is weaker than coupling between arsenic and a group III element, for example Ga, under the growth conditions described above. Accordingly, a III group element, for example Ga tends to migrate on the growth surface during the formation of the second p-type InGaP diffraction grating layer 10, unlike during the growth of the p-type GaAs intermediate layer 9. Here, the (311) A planes, which preferentially take in the III group element, for example Ga, are formed as the primary growth surfaces of the grooves 9b, so that the III group element, for example Ga, that migrated is preferentially taken into the (311) A planes of the grooves 9b. Consequently, InGaP grows easily on the bottom surface of the grooves 9b and hardly grows on the ridges 9a.

Therefore, the second p-type InGaP diffraction grating layer 10 grows dominantly in the grooves 9b of the p-type GaAs intermediate layer 9 and is thus selectively formed in the grooves 9b.

The bottom surfaces of the grooves 9b of the p-type GaAs intermediate layer are at approximately the same level as the lower surface of the first p-type InGaP diffraction grating layer 6. That is, the first p-type InGaP diffraction grating layer 6 and the second p-type InGaP diffraction grating layer 10 are at substantially identical heights.

The lower surface of each stripe of the first p-type InGaP diffraction grating layer 6 along the [011] direction is longer than the upper surface whereas the upper surface of each stripe of the second p-type InGaP diffraction grating layer 10 is longer than the lower surface.

Thus, the stripe patterns of the first and second p-type InGaP diffraction grating layers 6 and 10 form a first-order diffraction grating in which the stripes of the grating layers 6 and 10 alternately appear with a spacing from each other at a pitch of 158 nm along the [011] direction. The period Λ of the first-order grating is 158 nm, which is ½ of the period $Λ_O$ of the grating formed on the mask 7a.

Figure 1I:
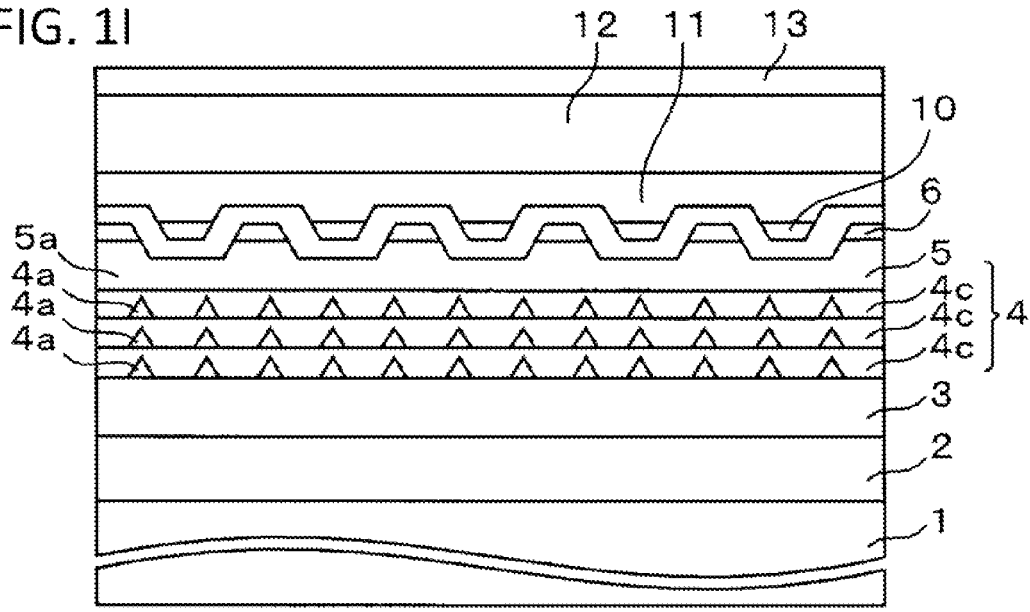

Then, as illustrated in FIG. 1I, a p-type GaAs overcoat layer 11 is formed on the second p-type InGaP diffraction grating layer 10 and the p-type GaAs intermediate layer 9 by MOCVD. The p-type GaAs overcoat layer 11 is formed to such a thickness that the upper surface of the p-type GaAs overcoat layer 11 becomes substantially flat.

Then, a 1.0 μm-thick p-type InGaP clad layer 12 and a 0.3 μm-thick p-type GaAs contact layer 13 are formed on the p-type GaAs overcoat layer 11 by MOCVD.

As illustrated in FIGS. 3A to 3D, the region along both sides of regions along optical waveguide regions of the p-type InGaP clad layer 12 and the p-type GaAs contact layer 13 are etched to pattern the surface profile into strips. The patterning method will be described below. FIGS. 3A to 3D are cross sections viewed from the [110] direction.

Figure 3A:
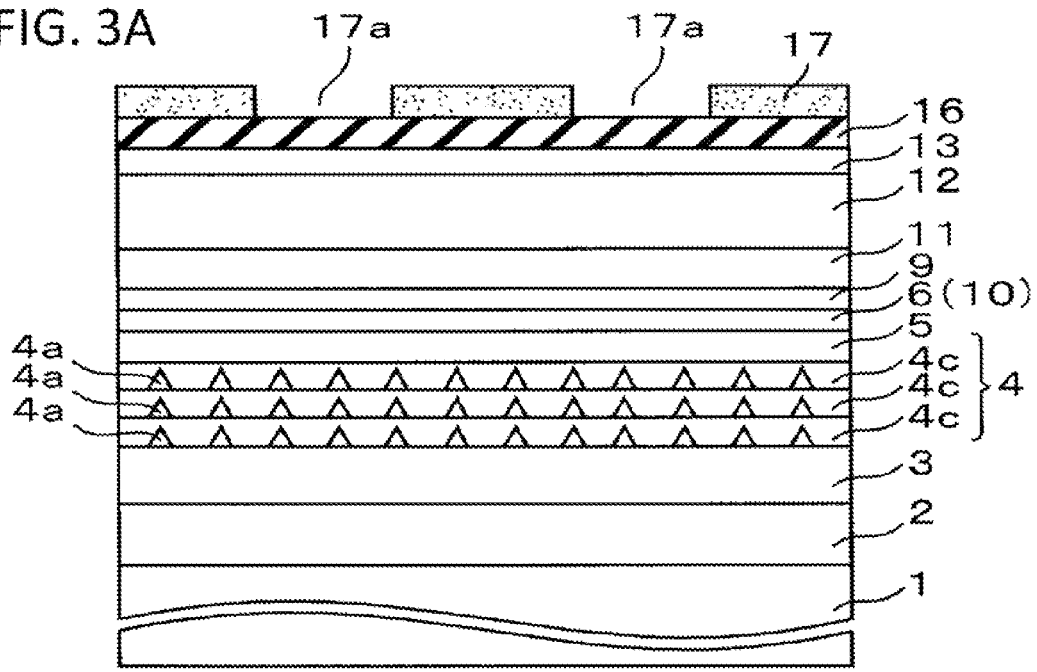
FIGS. 3A to 3D are cross-sectional views illustrating the process of fabricating the optical semiconductor device according to the first embodiment, viewed from the end surface.

First, as illustrated in FIG. 3A, a silicon oxide film 16 is formed on the p-type GaAs contact layer 13. A photoresist is applied on the silicon oxide film 16 and baked. The photoresist is then exposed and developed to form a resist pattern 17 having openings 17a at both sides of each of the regions above the optical waveguides regions.

Figure 3B:
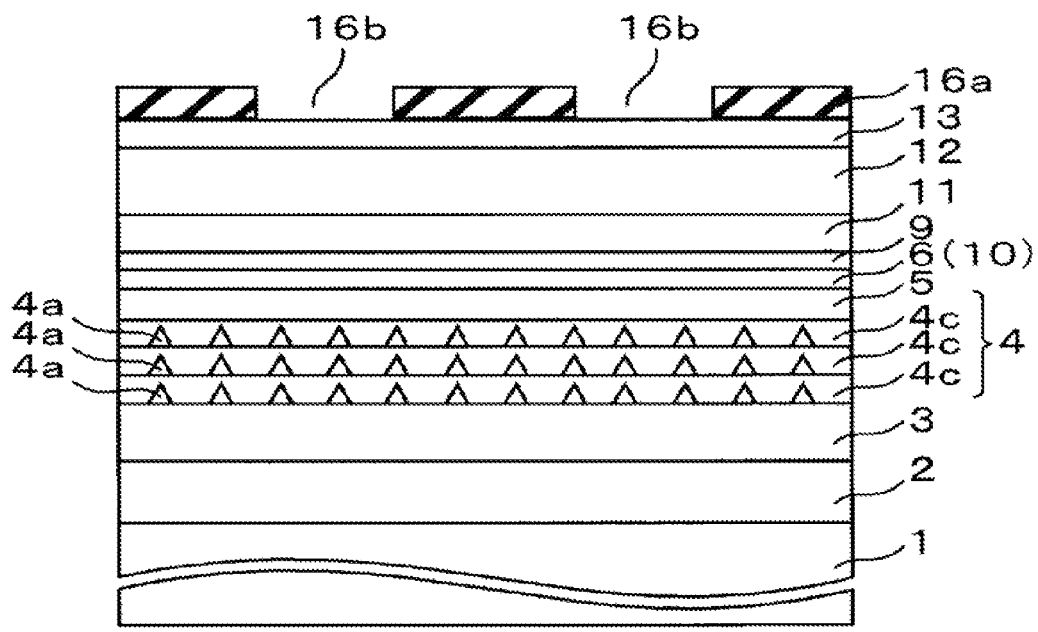

Then, the silicon oxide film 16 is etched through the openings 17a in the resist pattern 17 with buffered fluorinated acid, for example. The resist pattern 17 is then removed as illustrated in FIG. 3B. As a result, the silicon oxide layer 16 is patterned and is left as a mask 16a. The mask 16a covers the regions in the p-type GaAs contact layer 13 that are located above the optical waveguide regions and has openings 16b that expose the regions at both sides of each of the regions.

Figure 3C:
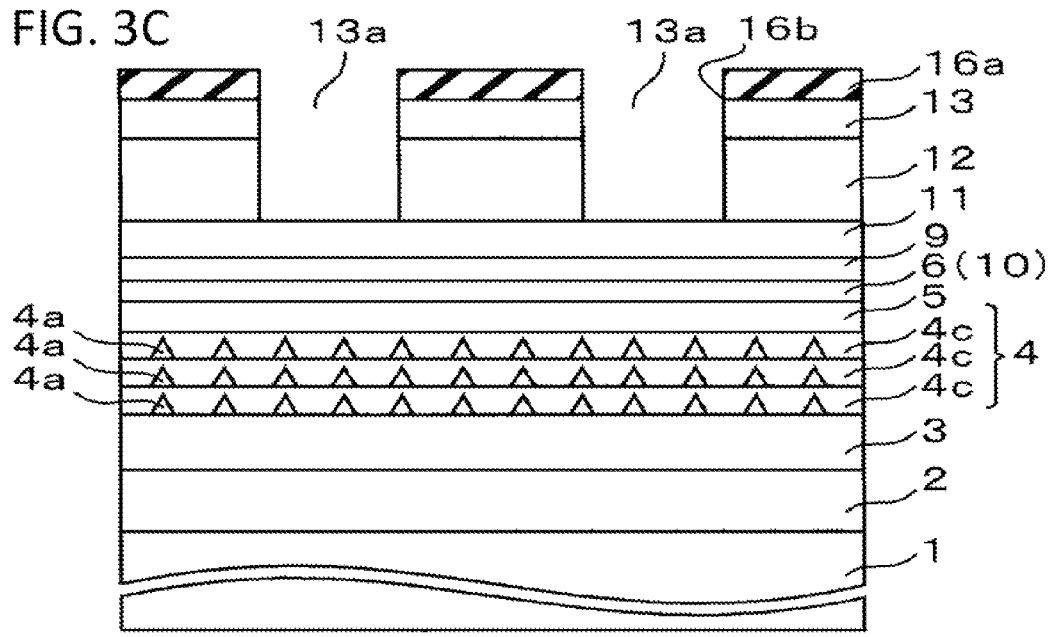

Then, as illustrated in FIG. 3C, the p-type GaAs contact layer 13 and the InGaP clad layer 12 in the regions that are not covered with the mask 16a are etched. The etching may be wet etching with an etchant such as the one given above or may be dry etching with a fluorine-based gas. The mask 16a is then removed with buffered fluorinated acid.

As a result, the p-type GaAs contact layer 13 and the InGaP clad layer 12 are left in the regions above the optical waveguide regions as stripes, and grooves 13a are formed at both sides of each stripe. Positions of the openings 16b in the mask 16a and etching conditions are chosen so that the each ridge region between the adjacent grooves 13a in the p-type GaAs contact layer 13 has a width of approximately several micrometers.

Figure 3D:
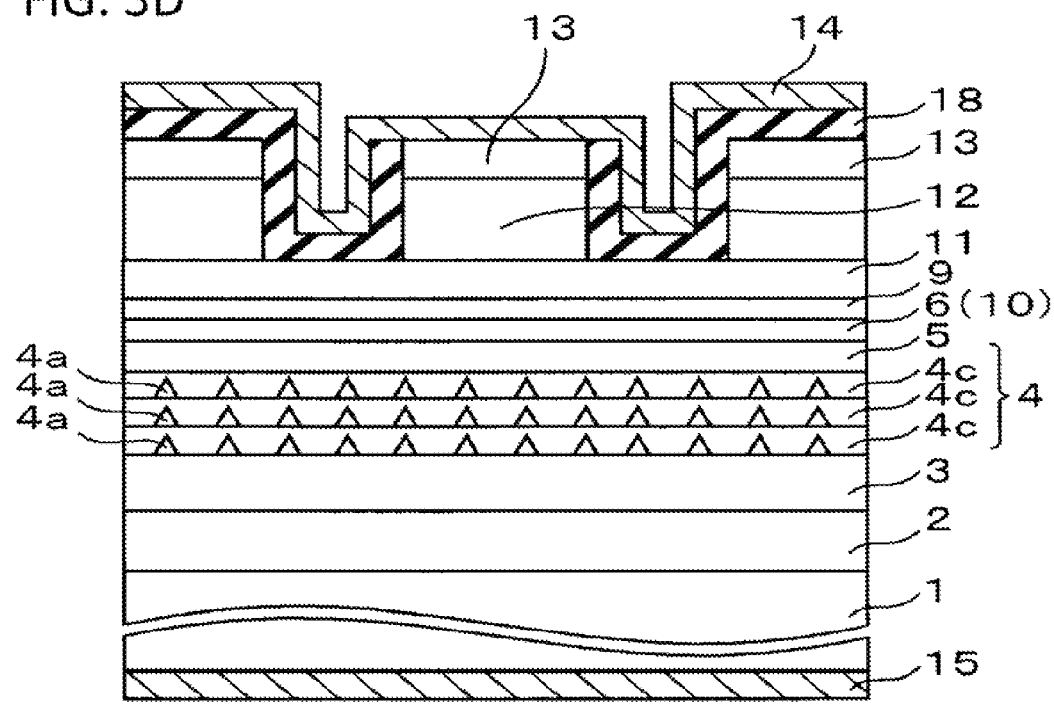

The step of forming the structure illustrated in FIG. 3D will be described below.

First, an insulating film 18, for example a silicon oxide film, is formed on the upper surface of the p-type GaAs contact layer 13 and the inner surfaces of the grooves 13a. A resist pattern (not depicted) having openings in the stripe regions above the optical waveguide regions is then formed on the insulating layer 18.

The insulating film 18 is etched by using the resist pattern as a mask to expose the upper surfaces of the ridged p-type GaAs contact layer 13. If the insulating film 18 formed is a silicon oxide film, buffered fluorinated acid is used as the etchant for the silicon oxide film.

Figure 1J:
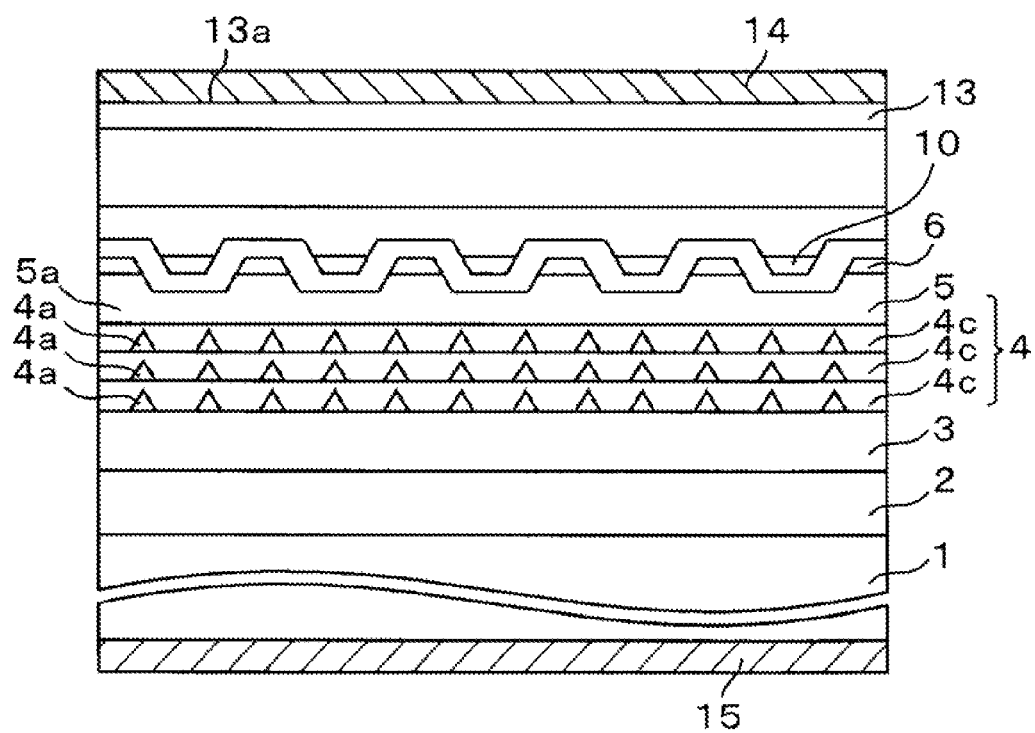

Then, Au, Zn and Au layers are formed in sequence on the insulating layer 18 and the ridged p-type contact layer 13 by vapor deposition. These metal films will be used as a p-electrode 14 as illustrated in FIG. 1J. AuGe and Au layers are formed in sequence on the lower surface of the n-type GaAs substrate 1 as an n-electrode 15 by vapor deposition.

Figure 4:
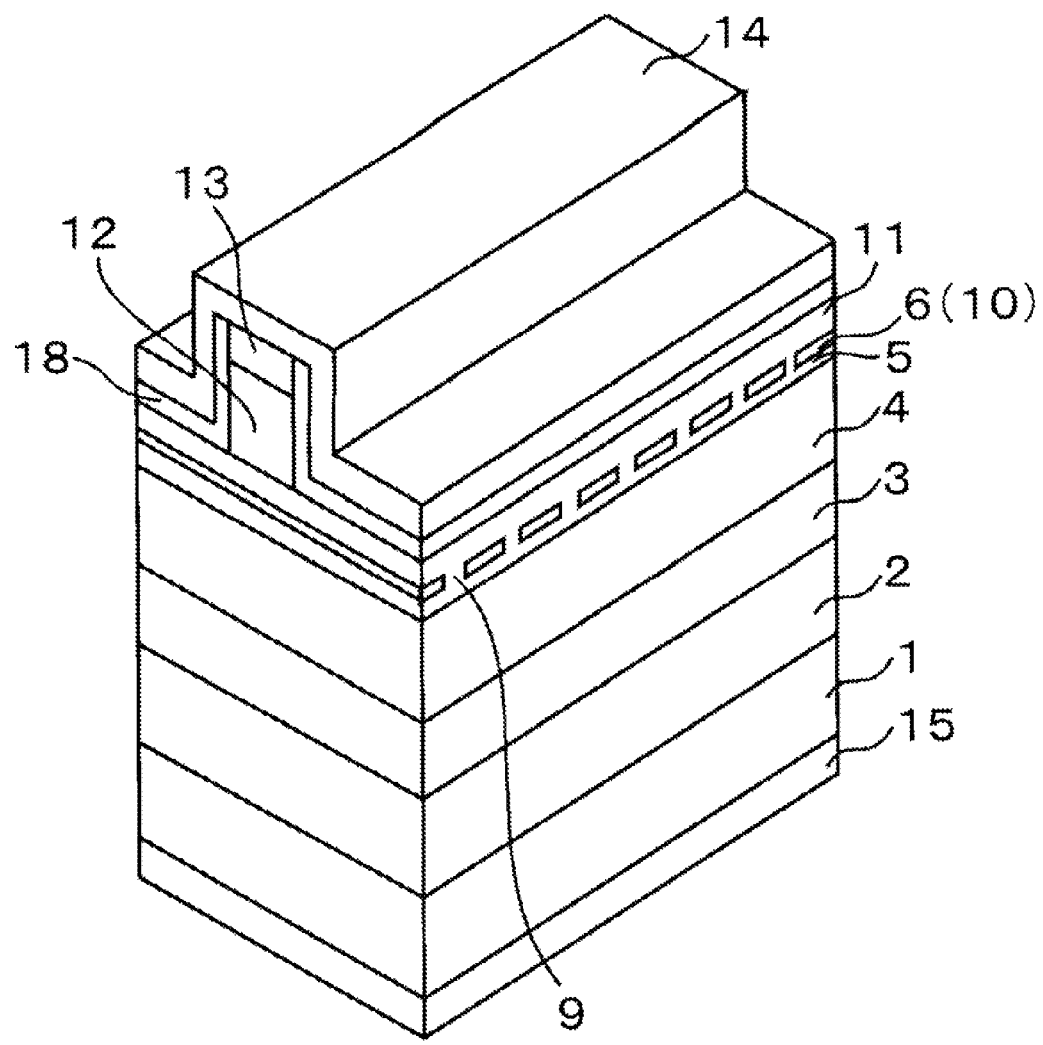
FIG. 4 is a perspective view of an optical semiconductor device according to an embodiment.

Then the n-type GaAs substrate 1 and the multilayer structure on the n-type GaAs substrate 1 are cleaved to produce a DFB semiconductor laser illustrated in a perspective view in FIG. 4.

A light transmissive film (not depicted) is formed on the light emitting end surface of the DFB semiconductor laser and a light reflecting film (not depicted) is formed on the light reflecting end surface. The light transmissive film and the light reflecting film are dielectric films such as silicon oxide or alumina films.

According to the embodiment described above, the first p-type InGaP diffraction grating layer 6 and the p-type GaAs waveguide layer 5 are etched by using the grating pattern mask 7a to form the ridges 5a with a second-order period 2Λ. The p-type GaAs intermediate layer 9 is formed on the surfaces of the grooves and ridges of the first p-type InGaP diffraction grating layer 6 and the p-type GaAs waveguide layer 5, and then the second p-type InGaP diffraction grating layer 10 is selectively formed on the surfaces of the grooves 9b of the p-type GaAs intermediate layer 9.

Thus, the stripe pattern of the first and second p-type InGaP diffraction grating layers 6 and 10 alternately formed along one direction may be used as a first-order diffraction grating having a short period of 158 nm. In addition, since the p-type InGaP diffraction grating layers 6 and 10 of the first-order diffraction grating are formed substantially at the same level as each other by adjusting the thickness of the p-type GaAs intermediate layer 9, the thickness of the layers on the n-type GaAs substrate 1 is reduced.

Furthermore, since the first diffraction grating is made of the InGaP layers 6 and 10, the first diffraction grating is not oxidized in an atmosphere containing oxygen after the second diffraction grating is formed. Moreover, since the second InGaP diffraction grating layer 10 is grown at a temperature not exceeding 700° C., for example at a temperature of 600° C., the grooves and ridges of the p-type GaAs waveguide layer 5 are not deformed and the quantum dots 4a under the p-type GaAs waveguide layer 5 is not degraded. That is, the p-type InGaP layers 6 and 10 are formed at a temperature below the degradation temperature of the quantum dots 4a.

The compositions of the first and second p-type InGaP layers 6 and 10 used as the first-order diffraction grating are not requested to be exactly identical; it is requested that the compositions are in a range where the strain in crystals is not relaxed.

According to the embodiment, since a resist pattern in the shape of a diffraction grating having a second-order period formed by holographic exposure is used in etching of the first p-type InGaP diffraction grating layer 6 and the ridges 5a of the p-type GaAs waveguide layer 5, the throughput of the etching process is not decreased.

Instead of the wet etching as described above, dry etching such as plasma etching or ECR etching may be used to etch the p-type GaAs waveguide layer 5 and the first p-type InGaP diffraction grating layer 6 with the mask 7a.

Figure 5:
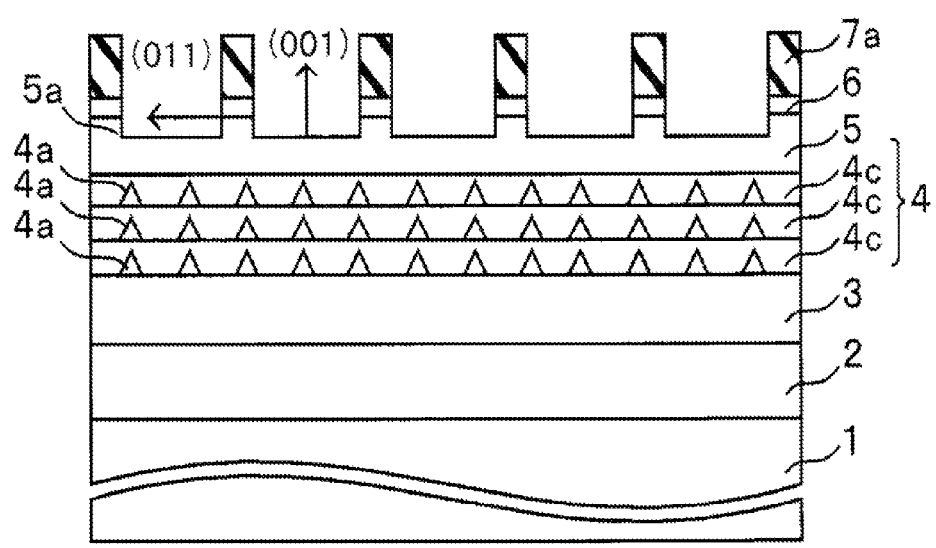
FIG. 5 is a cross-sectional view illustrating another example of a process of fabricating an optical semiconductor device according to the first embodiment.

If dry etching is used, the p-type GaAs waveguide layer 5 and the first p-type InGaP diffraction grating layer 6 are etched in a chlorine-based gas, for example. As a result, (011)

planes appear on the sides of the ridges 5a of the p-type GaAs layer 5 and the sides of the p-type InGaP diffraction grating layer 6 as illustrated in FIG. 5.

As in FIG. 1H, the second p-type InGaP layer 10 is selectively formed on the bottom surfaces of the grooves 9b of the p-type GaAs intermediate layer 9 formed on the p-type GaAs waveguide layer 5 and the first p-type InGaP diffraction grating layer 6 to form a first-order diffraction grating in the same way described above.

In FIG. 5, the lower and upper surfaces of the stripes of the first p-type InGaP diffraction grating layer 6 have the same length along the [011] direction. The p-type GaAs intermediate layer 9 formed subsequently is grown in the same way described above.

As seen from the foregoing, the length of the lower surface of each of the strips of the first p-type InGaP diffraction grating layer 6 is longer than or equal to the length of the upper surface along the [011] direction of the optical semiconductor device according to the embodiment whereas the length of the upper surface of each of the stripes of the second p-type InGaP layer 10 is longer than the length of the lower surface.

The compound semiconductor layer formed on the n-type GaAs substrate 1 has a zincblende crystal structure.

FIGS. 6A to 6H are cross-sectional views illustrating a process of fabricating a DFB semiconductor laser, which is an optical semiconductor device according to a second embodiment of the present invention, viewed from the [−110] direction. The direction from right to left in FIGS. 6A to 6H is a [011] direction.

Figure 6A:
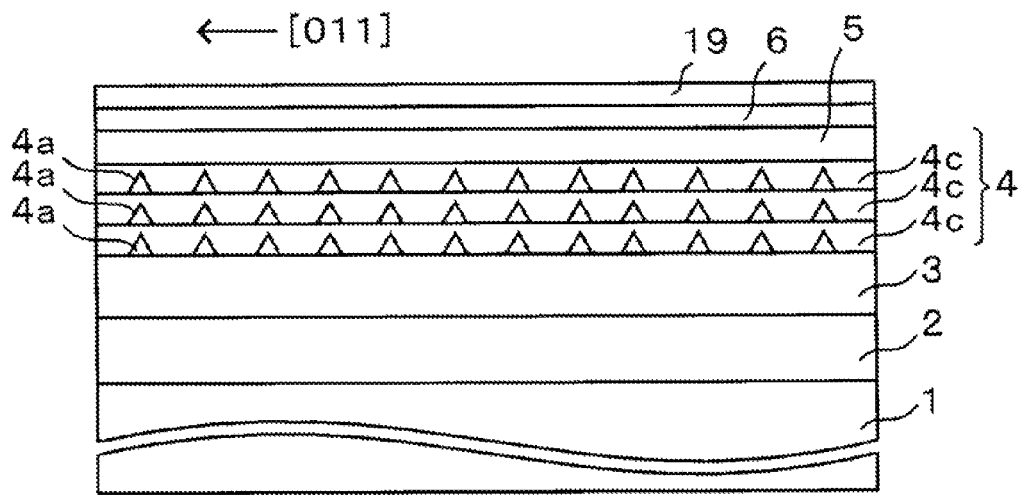
FIGS. 6A to 6H are cross-sectional views illustrating a process of fabricating an optical semiconductor device according to a second embodiment, taken along a wave guiding direction.

A method for forming the multilayer structure illustrated in FIG. 6A will be described below.

First, an n-type GaAs buffer layer 2, an n-type $Al_{0.3}Ga_{0.7}As$ clad layer 3, and an active layer 4 are formed in sequence on the primary surface, for example a (001) plane, of an n-type GaAs substrate 1 as in the first embodiment. The active layer 4 is formed under the same conditions as those in the first embodiment and includes a non-doped GaAs layer 41, quantum dots 4a, a wetting layer 4b, and a non-doped GaAs layer 4c as illustrated in FIG. 2, for example.

Then, a 50-nm-thick p-type GaAs waveguide layer 5 and a 20-nm-thick first p-type InGaP diffraction grating layer 6 are formed on the active layer 4 by MBE. A 10-nm-thick p-type GaAs protective layer 19 is formed on the first p-type InGaP diffraction grating layer 6 by MBE.

Figure 6B:
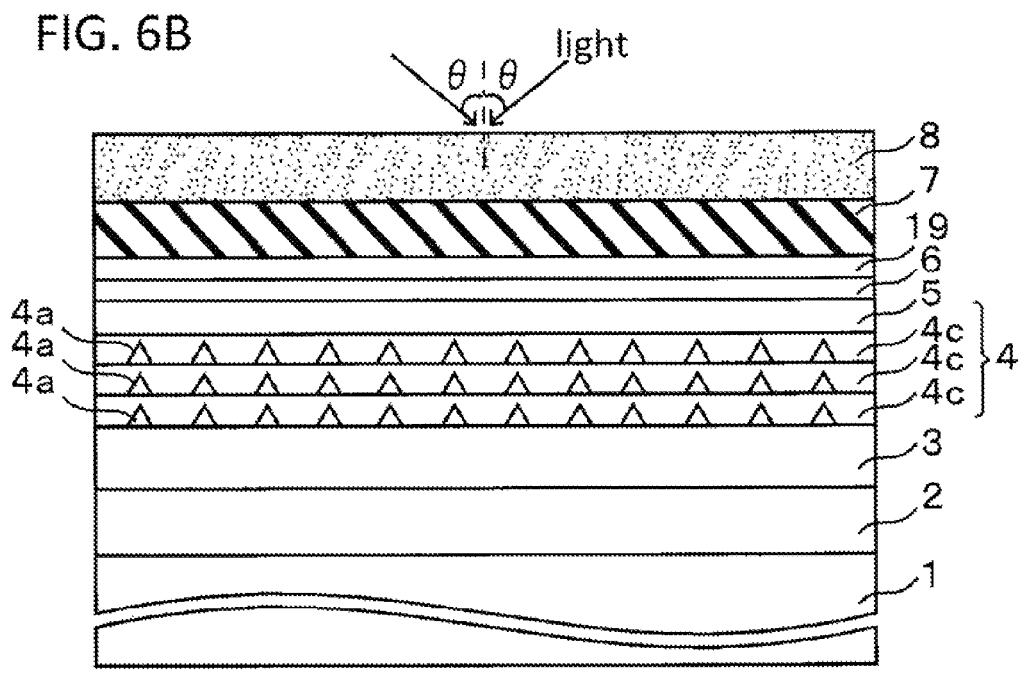

A process of forming the structure illustrated in FIG. 6B will be described below.

First, a silicon oxide film 7 is formed on the first p-type InGaP diffraction grating layer 6 by CVD, then a photoresist 8 is applied onto the silicon oxide film 7 and is baked.

Then, the photoresist 8 is exposed by holographic exposure to form a latent image of a holographic stripe pattern on the photoresist 8 as in the first embodiment. As in the first embodiment, the period $\Lambda_O$ of the holographic stripe is the period of a second-order diffraction grating and is twice the period of a first-order diffraction grating, which will be described later.

Figure 6C:
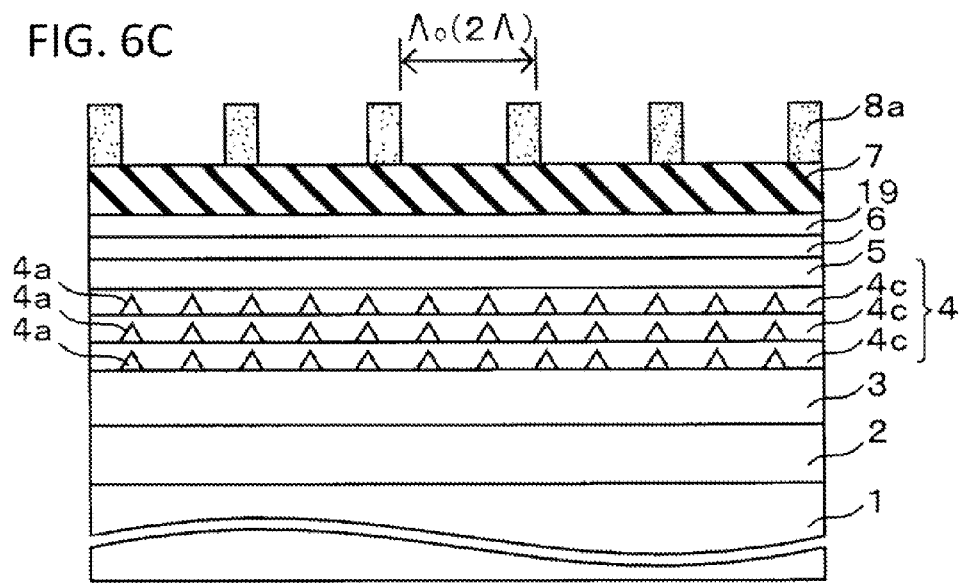

Then, the photoresist 8 is developed and dried. As a result, a grating resist pattern 8a having 79-nm-wide repetitive stripes with a pitch of 316 nm along the direction is formed on the silicon oxide film 7 as illustrated in FIG. 6C.

Figure 6D:
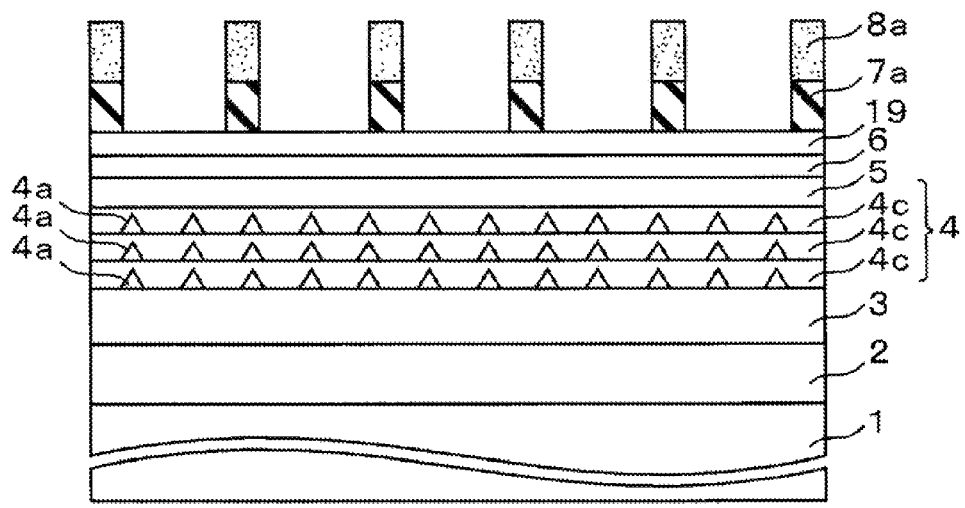
Figure 6E:
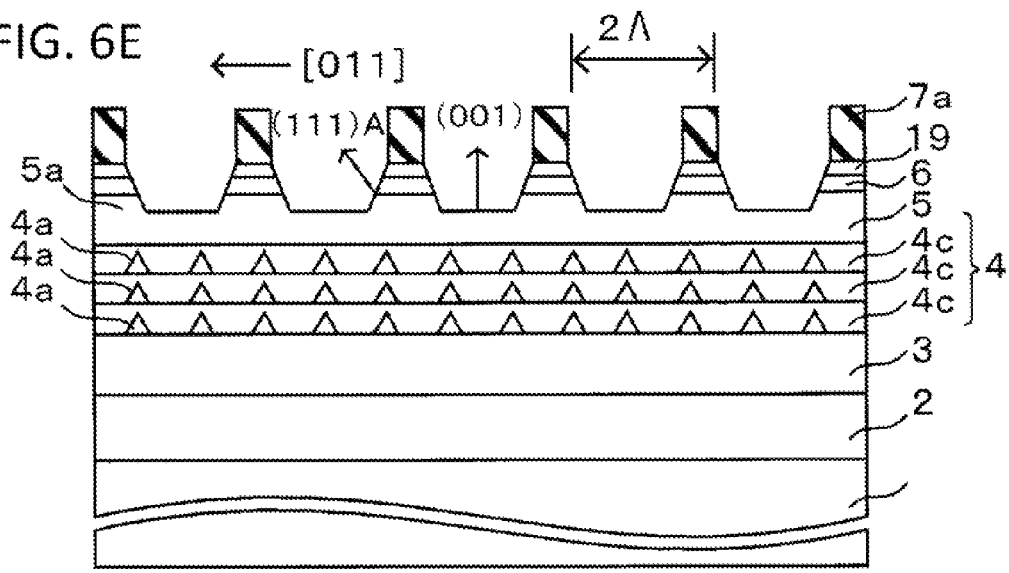

Then, as illustrated in FIG. 6D, regions of the silicon oxide film 7 that are exposed in the resist pattern 8a are etched by reactive ion etching (RIE) with $CF_4$, for example. The silicon oxide film 7 patterned into the shape of a grating will be used as a mask 7a. Then the resist pattern 8a is removed by using a solvent.

Regions in the p-type GaAs protective layer 9 that are exposed in the grating pattern having the period $\Lambda_O$ of the mask 7a are etched with an ammonium-based etchant. As a result, the p-type GaAs protective layer 19 is patterned in the shape of a grating and the first p-type InGaP diffraction grating layer 6 is exposed in the slits in the grating stripe pattern of the p-type GaAs protective layer 19.

Then, the regions of the first p-type InGaP diffraction grating layer 6 that are exposed in the slits in the mask 7a and the grating of the p-type GaAs protective layer 19 are etched with a hydrochloric-acid-based etchant. As a result, the first p-type InGaP diffraction grating layer 6 is patterned in the shape of the grating and the p-type GaAs waveguide layer 5 is exposed in the slits in the grating stripe pattern of the first p-type InGaP diffraction grating layer 6.

Then, the regions of the p-type GaAs waveguide layer 5 that are exposed in the slits in the mask 7a and the grating pattern of the first p-type InGaP diffraction grating layer 6 are etched to a depth of approximately 30 nm, for example, with an ammonium-based etchant.

As a result, multiple periodic ridges are formed on the p-type GaAs waveguide layer 5 along the [011] direction. The stripe of each ridge 5a is approximately 79 nm wide. The pitch of the ridges 5a is approximately 316 nm. Thus, (111) A planes appear on the sides of the ridges 5a. In addition, (001) planes appear at the bottom surfaces of the grooves formed between the ridges 5a. Then, the mask 7a is removed with buffered fluorinated acid.

Figure 6F:
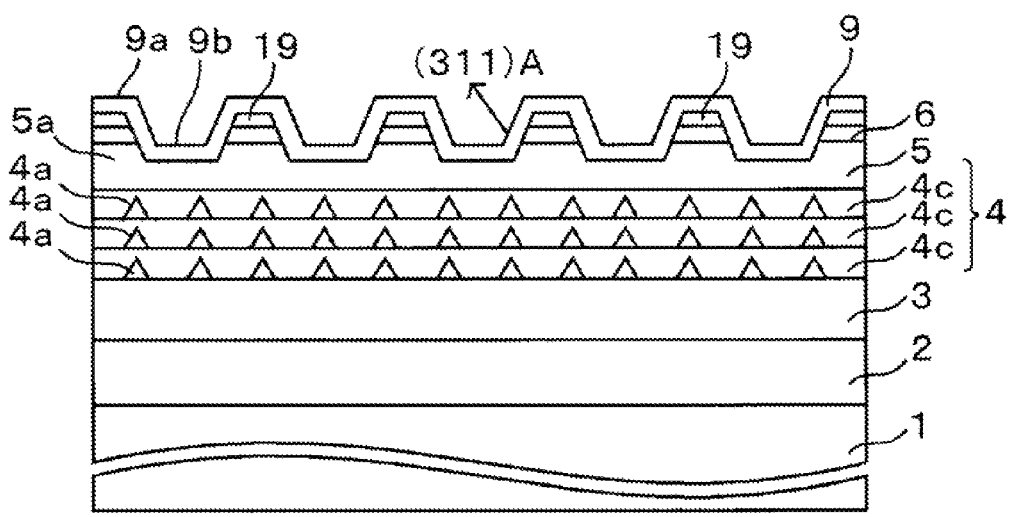

Then, as illustrated in FIG. 6F, a p-type GaAs intermediate layer 9 is formed on grooves and ridges which appear in the surface of the grading-shaped p-type GaAs protective layer 19, first p-type InGaP diffraction grating layer 6, and p-type GaAs waveguide layer 5 by MOCVD under the same conditions as those in the first embodiment.

The upper surface of the p-type GaAs intermediate layer 9 reflects the underlying grooves and ridges so that ridges 9a and grooves 9b are periodically formed along the [011] direction. (311) A planes appear on the sides of each ridge of the p-type GaAs intermediate layer 9.

The p-type GaAs intermediate layer 9 is formed to such a thickness that the bottom surfaces of the grooves 9b are at the same level as the lower surface of the first p-type InGaP diffraction grating layer 6 as in the first embodiment.

Figure 6G:
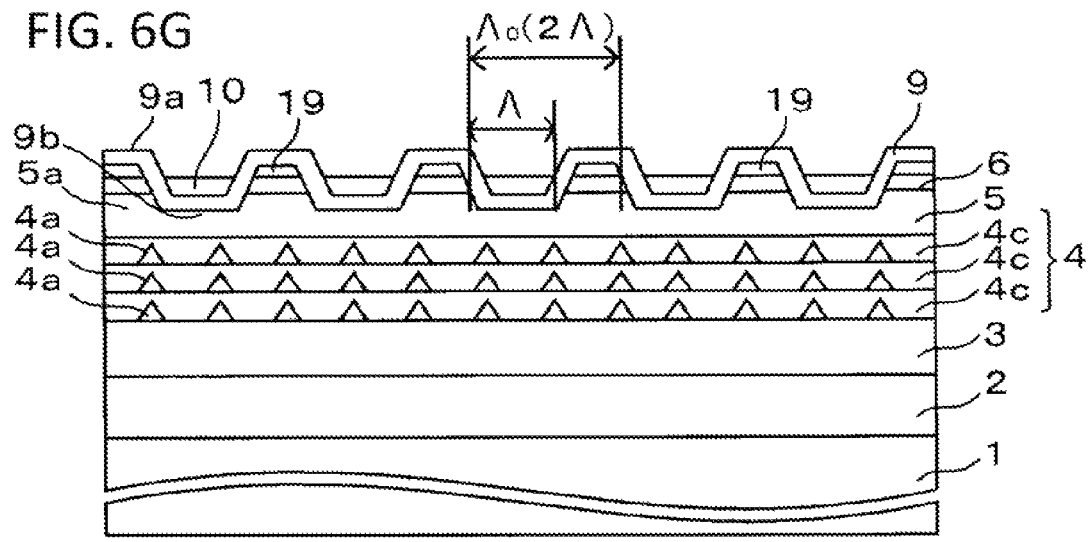

Then, as illustrated in FIG. 6G, a second p-type InGaP diffraction grating layer 10 is formed to a thickness of approximately 20 nm by MOCVD under the same conditions as those in the first embodiment.

As described with respect to the first embodiment, a group III element migrates on the upper surface of the p-type GaAs intermediate layer 9 and is preferentially taken into the (311) A planes, which are primary growth surfaces of the grooves 9b, so that InGaP grows easily on the bottom surfaces of the grooves 9b. Consequently, InGaP hardly grows on the p-type GaAs protective layer 19 above the ridges 9a.

Thus, the second p-type InGaP diffraction grating layer 10 is selectively formed in the grooves 9b of the p-type GaAs intermediate layer 9 as in the first embodiment. The compositions of the first and second p-type InGaP layers 6 and 10 used as the first-order diffraction grating are not requested to be exactly identical; it is requested that the compositions are in a range where the strain in crystals is not relaxed.

In this way, the grooves 9b of the p-type GaAs intermediate layer 9 and the first p-type InGaP diffraction grating layer 6 have substantially the same height from the upper surface of the n-type GaAs substrate 1 and are located at the same level.

The length of the lower surface of each stripe of the first p-type InGaP diffraction grating layer 6 along the direction of the period of the diffraction grating is longer than the length of the upper surface whereas the upper surface of each stripe of the second p-type InGaP diffraction grating layer 10 is longer than the lower surface.

The stripe pattern of the first and second p-type InGaP diffraction grating layers 6 and 10 is used as a first-order diffraction grating having a period Λ of 158 nm.

Figure 6H:
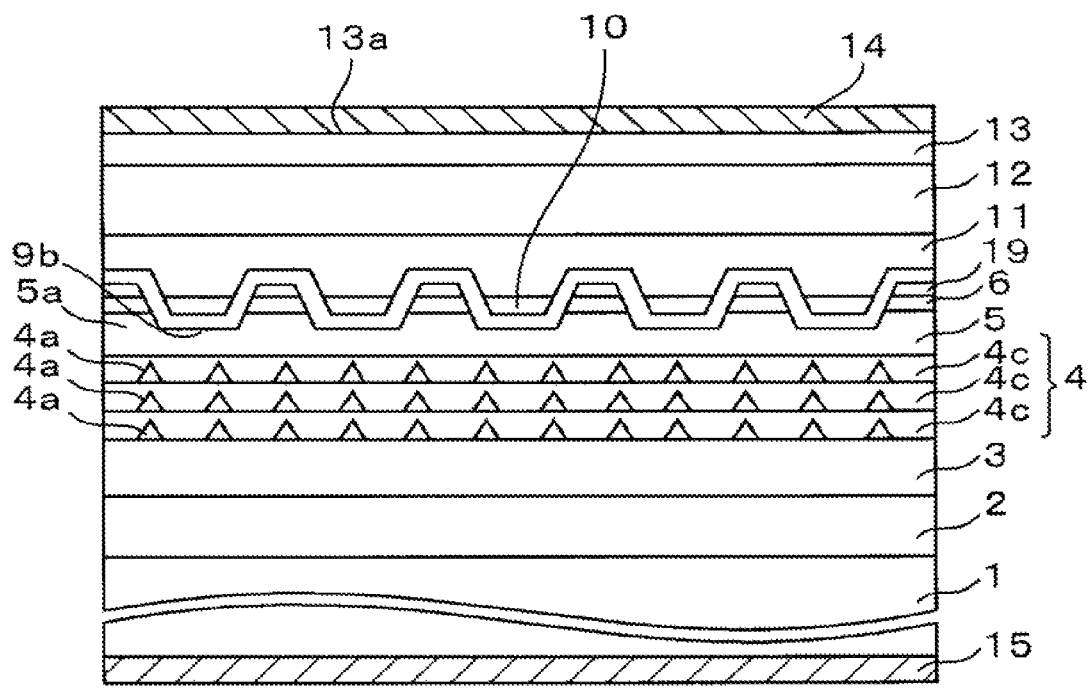

Then, as illustrated in FIG. 6H, a p-type GaAs overcoat layer 11 is formed on the second p-type InGaP diffraction grating layer 10 and the p-type GaAs intermediate layer 9 by MOCVD. The p-type GaAs overcoat layer 11 is formed to such a thickness that the upper surface of the p-type GaAs overcoat layer 11 becomes substantially flat.

Then, a p-type InGaP clad layer 12 and a p-type GaAs contact layer 13 are formed in sequence on the p-type GaAs overcoat layer 11 by MOCVD as in the first embodiment.

The p-type InGaP clad layer 12 and the p-type GaAs contact layer 13 are then patterned in stripes along optical waveguide regions in the same way as illustrated in FIGS. 3A to 3C.

Figure 7:
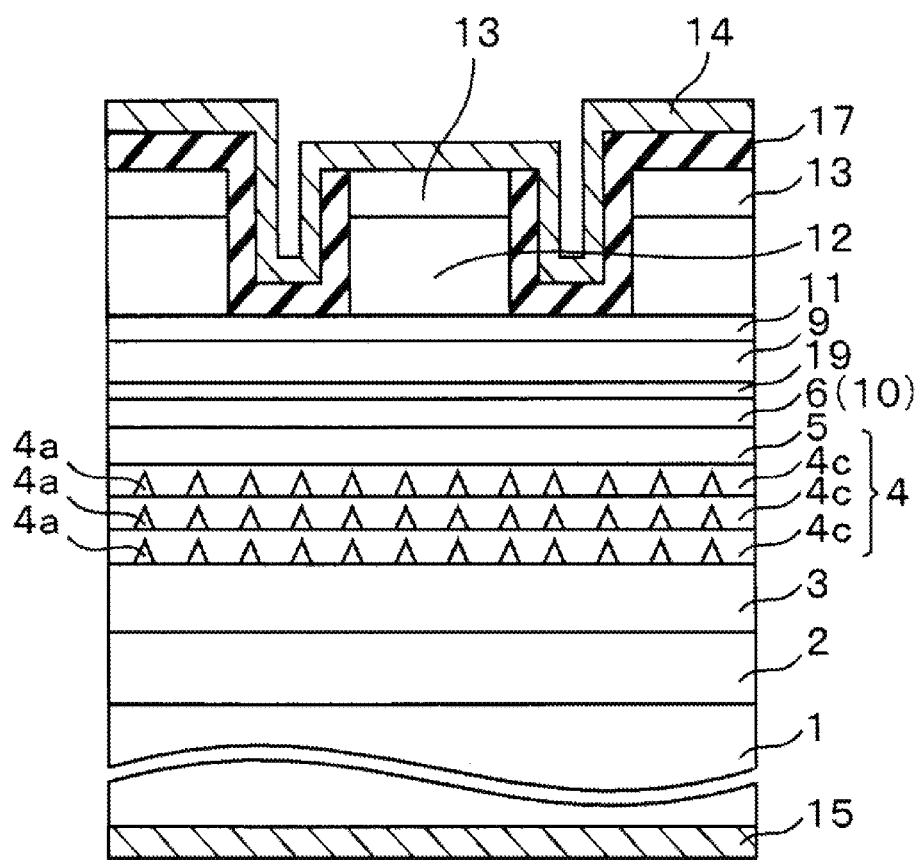
FIG. 7 is a cross-sectional view of the optical semiconductor device according to the second embodiment, viewed from another side.

Then, as illustrated in FIG. 6H, a p-electrode 14 is formed on the ridged p-type GaAs contact layer 13 as in the first embodiment. An n-electrode 15 is formed on the lower surface of the n-type GaAs substrate 1 as in the first embodiment. FIG. 7 illustrates a cross-section of the structure thus formed, viewed from a [110] direction.

Then the n-type GaAs substrate 1 and the multilayer structure on the n-type GaAs substrate 1 are cleaved to produce a DFB semiconductor laser as illustrated in the perspective view in FIG. 4. The p-type GaAs protective layer 19 is depicted integrally with the p-type GaAs intermediate layer 9 on the protective layer 19 in FIG. 4.

As has been described above, according to the embodiment, the p-type GaAs protective layer 19 is formed on the first p-type InGaP diffraction grating layer 6, then the p-type GaAs protective layer 19, the first p-type InGaP diffraction grating layer 6 and the p-type GaAs waveguide layer 5 are etched by photolithography using holographic exposure to form a second-order diffraction grating.

With this configuration, the p-type GaAs protective layer 19 is located on the second-order diffraction grating formed in the first p-type InGaP diffraction grating layer 6. The p-type GaAs protective layer 19 prevents substitution of phosphorous in the first p-type InGaP diffraction grating layer 6 with arsenic in the growth gas to suppress degradation of the second-order diffraction grating when heated in order to form the p-type GaAs intermediate layer 9 on the second-order diffraction grating by MOCVD.

According to the embodiment, the second p-type InGaP diffraction grating layer 10 is formed with a spacing between the stripes of the grating pattern of the first p-type InGaP diffraction grating layer 6 of the second-order diffraction grating formed by using the resist pattern 8a formed by holographic exposure as in the first embodiment.

Accordingly, the first-order diffraction grating may be formed from the InGaP layers 6 and 10 with a period of as short as 158 nm, for example. In addition, the striped p-type InGaP layers 6 and 10 of the first diffraction grating are formed at substantially the same level by adjusting the thickness of the GaAs intermediate layer 9.

Furthermore, the grooves and ridges of the second-order diffraction grating are formed from the p-type GaAs waveguide layer 5 and the first p-type InGaP diffraction grating layer 6 before the formation of the first-order diffraction grating. These materials are resistant to oxidizing in an atmosphere containing oxygen and therefore do not degrade the diffraction gratings. Since the p-type InGaP diffraction grating layers 6 and 10 are grown at a temperature not higher than 700° C., for example at approximately 600° C., the underlying active layer 4 including quantum dots 4a is not degraded.

As in the first embodiment, dry etching such as plasma etching or ECR etching may be used to etch the p-type GaAs waveguide layer 5 and the first p-type InGaP diffraction grating layer 6 with the mask, in which case the sides of the p-type InGaP diffraction grating layer 6 will be (011) planes as illustrated in FIG. 5.

In the embodiments described above, the stripes of the grating pattern of the first and second p-type InGaP diffraction grating layers 6 and 10 are arranged with a period of 158 nm. However, the period is not limited to 158 nm; the period may be chosen to be on the order of emission wavelength of light to be guided.

The duty ratio of the diffraction grating formed from the first and second p-type InGaP diffraction grating layers is not limited to 1; the duty ratio may be other value. That is, the duty ratio of the diffraction grating may be controlled by changing the height of the ridges 5a of the p-type GaAs waveguide layer 5 and the length of the ridges 5a along the [011] direction.

By adjusting the thickness of the p-type GaAs intermediate layer 9 formed between the first p-type InGaP diffraction grating layer 6 and the second p-type InGaP diffraction grating layer 10, the first and second p-type InGaP diffraction grating layers 6 and 10 may be formed to different heights from the n-type GaAs substrate 1. This may control the coupling coefficient κ.

Figure 8:
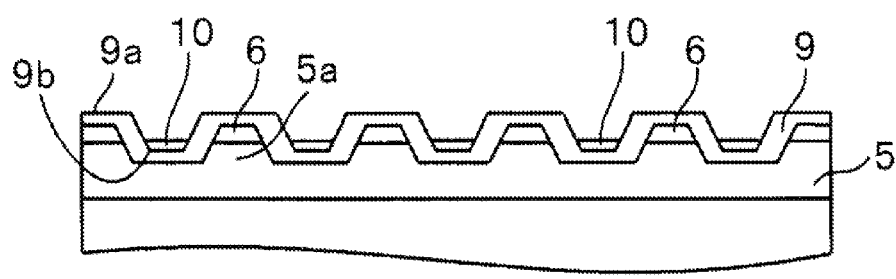
FIG. 8 is a cross-sectional view of another diffraction grating that may be used with the optical semiconductor device according to an embodiment.

For example, the p-type GaAs intermediate layer 9 may be formed thin so that the lower surface of the second p-type InGaP diffraction grating layer 10 is located at a level lower than the first p-type InGaP diffraction grating layer 6 as illustrated in FIG. 8. In this case, the second p-type InGaP diffraction grating layer 10 may be formed thinner than the first p-type InGaP diffraction grating layer 6.

Figure 9:
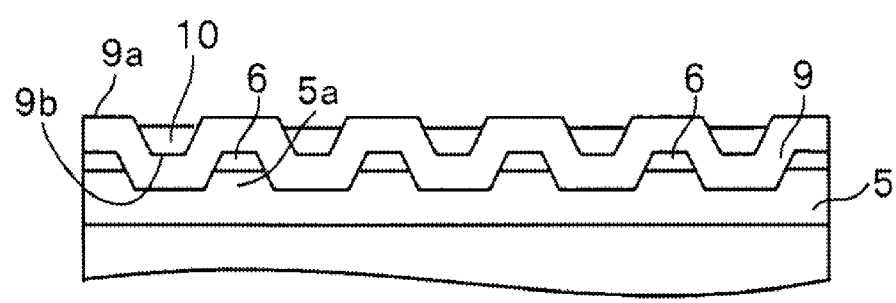
FIG. 9 is a cross-sectional view of yet another diffraction grating that may be used with the optical semiconductor device according to an embodiment.

Alternatively, the p-type GaAs intermediate layer 9 may be formed thick so that the lower surface of the second p-type InGaP diffraction grating layer 10 is located at a level higher than the first p-type InGaP diffraction grating layer 6 as illustrated in FIG. 9. In this case, the second p-type InGaP diffraction grating layer 10 may be formed thicker than the first p-type InGaP diffraction grating layer 6.

Figure 10A:
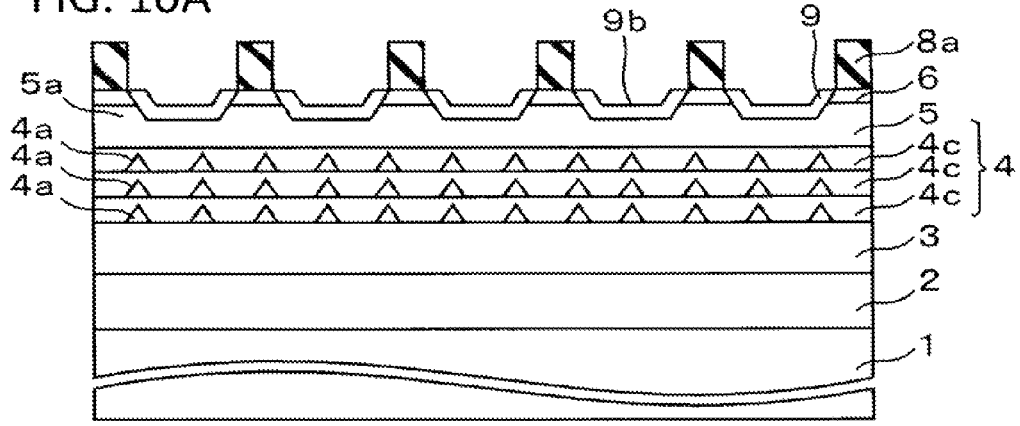
FIGS. 10A to 10C are cross-sectional views illustrating another process of fabricating a diffraction grating that may be used with a semiconductor device according to an embodiment.
Figure 10B:
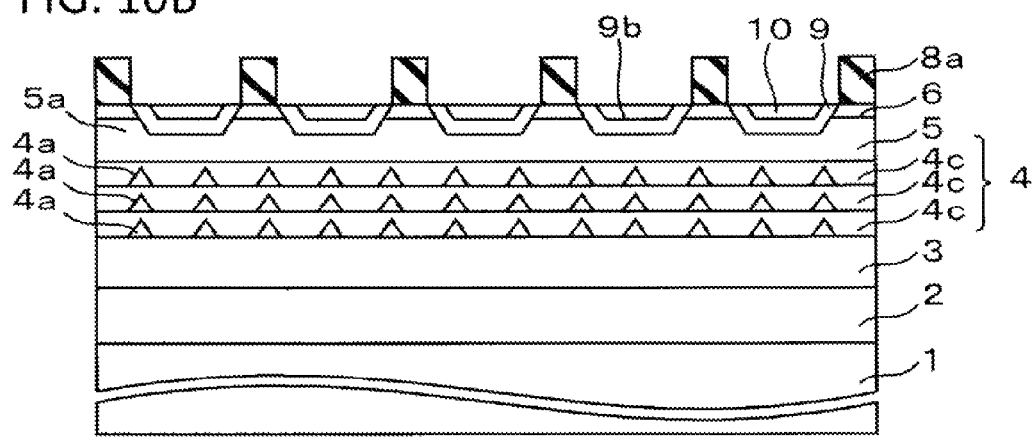
Figure 10C:
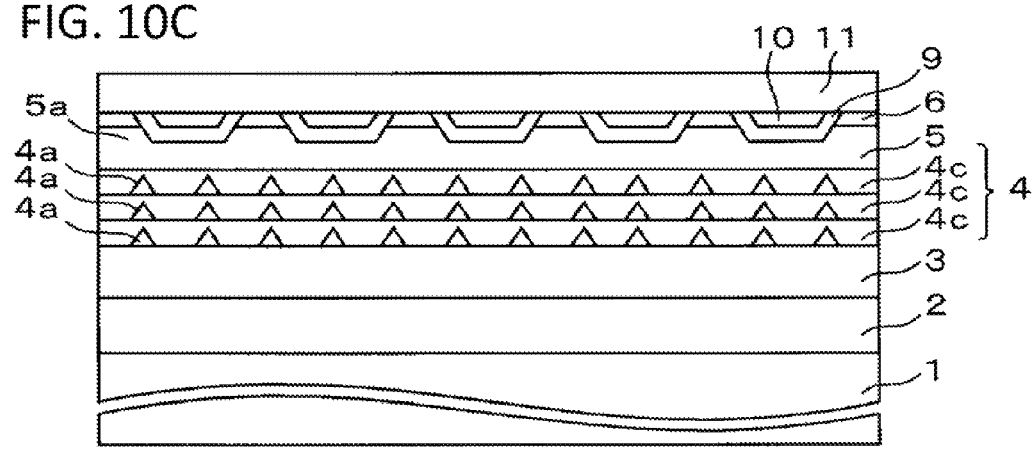

While the mask 7a is removed before the formation of the p-type GaAs intermediate layer 9 in the embodiments described above, the mask 7a may be removed after the formation of the p-type GaAs intermediate layer 9. If the mask 7a is made of a dielectric film, for example a silicon oxide film or a silicon nitride film, the p-type GaAs intermediate layer 9 is not formed on the mask 7a but instead selectively formed in the grooves between ridges of the first p-type InGaP diffraction grating layer 6 and the p-type GaAs waveguide layer 5 as illustrated in FIG. 10A. In this case, the second p-type InGaAs diffraction grating layer 10 is selectively formed in the grooves 9b as illustrated in FIG. 10B, then the mask 7a is removed. Then the p-type GaAs overcoat layer 11 is formed on the first and second p-type InGaP diffraction grating layers 6 and 10 and the p-type GaAs intermediate layer 9 as illustrated in FIG. 10C.

While the diffraction gratings are formed from InGaP layers in the embodiments described above, the diffraction gratings may be formed from layers of other group III-V compound semiconductor containing phosphorous, for example InP, AlP, GaP, InAlP, AlGaP, InAlGaP, InAsP, AlAsP, GaAsP, InGaAsP, InAlAsP, AlGaAsP, or InAlGaAsP.

The two semiconductor layers containing phosphorous that are alternately formed along one direction in the first diffraction grating may be of different compositions.

Furthermore, the compound semiconductor formed around the diffraction grating layers containing phosphorous is not limited to GaAs; the compound semiconductor may be formed of other material that has a refractive index different from that of the diffraction grating layers. For example, if the diffraction grating layer with a first-order period $\Lambda$ is made of InGaAsP, the diffraction grating layer may be surrounded with an InP layer.

The first-order diffraction gratings described above is not limited to application to DFB semiconductor laser or DBR semiconductor laser; the first-order diffraction gratings may also be applied to other optical semiconductor devices, for example optical filters, optical couplers, and optical waveguides.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical semiconductor device fabrication method, comprising:
   forming a first semiconductor layer and a first diffraction grating layer above a substrate;
   forming a grating pattern mask above the first diffraction grating layer, the mask including a plurality of stripes spaced from each other along a first direction; etching the first diffraction grating layer exposed in the grating pattern mask;
   etching the first semiconductor layer exposed in the grating pattern mask to form a plurality of ridges in the first semiconductor layer along the first direction;
   forming a second semiconductor layer on a bottom surface of one of a plurality of first grooves formed between adjacent ones of the plurality of ridges in the first semiconductor layer;
   removing the grating pattern mask before or after the step of forming the second semiconductor layer;
   selectively forming a second diffraction grating layer dominantly in second grooves in the second semiconductor layer, the second grooves in the second semiconductor layer being above the first grooves between the ridges, the second diffraction grating layer having a refractive index different from a refractive index of the second semiconductor layer; and
   forming a third semiconductor layer on diffraction gratings included in the first and the second diffraction grating layers and on the second semiconductor layer.

2. The optical semiconductor device fabrication method according to claim 1, wherein when the grating pattern mask is removed before the step of forming the second semiconductor layer, the second semiconductor layer is formed on the first diffraction grating layer as well.

3. The optical semiconductor device fabrication method according to claim 1, wherein when the grating pattern mask is removed after the step of forming the second semiconductor layer, the grating pattern mask is made of a dielectric.

4. The optical semiconductor device fabrication method according to claim 1, wherein the second semiconductor layer is formed to a thickness equal to a value of the height of the ridges of the first semiconductor layer and the second diffraction grating layer is formed to a thickness equal to the thickness of the first diffraction grating layer.

5. The optical semiconductor device fabrication method according to claim 1, wherein the plurality of stripes of the grating pattern mask are formed by using a resist mask, the resist mask being formed by exposing a photoresist by holographic exposure and then developing the photoresist.

6. The optical semiconductor device fabrication method according to claim 1, further including:
   forming a fourth semiconductor layer on the first diffraction grating layer before forming the grating pattern mask;
   etching the fourth semiconductor layer exposed in the grating pattern mask to expose the first diffraction grating in the grating pattern mask; and
   forming the third semiconductor layer on the fourth semiconductor layer as well.

7. The optical semiconductor device fabrication method according to claim 1, wherein the first and the second diffraction grating layers are made of a compound semiconductor containing phosphorous.

8. The optical semiconductor device fabrication method according to claim 7, wherein the first and the second semiconductor layers are made of gallium arsenide.

9. The optical semiconductor device fabrication method according to claim 1, wherein:
   an active layer including quantum dots are formed between the first semiconductor layer and the substrate; and
   the first semiconductor layer, the first diffraction grating layer, the second semiconductor layer and the second diffraction grating layer are formed at a temperature lower than degradation temperature of the quantum dots.

* * * * *